(12) United States Patent
Buck et al.

(10) Patent No.: US 6,396,062 B1
(45) Date of Patent: May 28, 2002

(54) PORTABLE LASER BEAM MONITOR

(75) Inventors: Jesse D. Buck, San Marcos; Robert G. Ozarski, Poway, both of CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/454,693

(22) Filed: Dec. 3, 1999

(51) Int. Cl.[7] .................................................. G01J 1/42

(52) U.S. Cl. ...................................... 250/372; 250/330

(58) Field of Search ................................ 250/372, 373, 250/336.1, 330, 334, 333, 332, 331; 359/109, 110

(56) References Cited

U.S. PATENT DOCUMENTS 5,745,268 A * 4/1998 Eastvold et al. ............ 359/110

* cited by examiner

Primary Examiner—Hung Xuan Dang
(74) Attorney, Agent, or Firm—John R. Ross, Esq.

(57) ABSTRACT

A portable laser beam monitor utilizes a plurality of optical trains to monitor ultraviolet laser beam profiles at a plurality of positions along a laser beam path. A preferred embodiment useful for monitoring beam profiles of lithography lasers measures the beam profile at the front aperture, the rear aperture, the shutter plane and at infinity (the divergence plane). The beam profiles are imaged on a fluorescent screen which is monitored by a visible light camera. Images of the profiles may be discharged on the screen of a lap top computer.

10 Claims, 3 Drawing Sheets

PORTABLE LASER BEAM MONITOR

BACKGROUND OF THE INVENTION

One characteristic of deep ultraviolet lasers which is of great importance for success in lithography system usage is the optical intensity profile of the laser beam, called the beam profile here. A beam profile mathematically or pictorially defines the shape of the laser beam in terms of intensity at some defined axial position which may be anywhere within the optical resonator cavity of the laser, or anywhere along the output beam which is considered to start at the output coupler (OC). The standard approach to obtain deep ultraviolet (DUV) beam profiles for many years requires a lab setup with massive high stability optical tables, but the commercial users of the lasers will almost never have access to bulky lab equipment in integrated circuit fabrication plants. As a result, it is typical to run an installed laser to end of life with no beam profile data beyond the initial factory certification data of the laser when it was brand new. Profiles of a laser beam differ along the path of the beam. Knowledge of the profile at various positions along the path can be very valuable when aligning the laser for optimum performance.

What is needed is a portable device for field measurement of laser beam profiles.

SUMMARY OF THE INVENTION

The present invention provides a portable laser beam monitor utilizes a plurality of optical trains to monitor ultraviolet laser beam profiles at a plurality of positions along a laser beam path. A preferred embodiment useful for monitoring beam profiles of lithography lasers measures the beam profile at the front aperture, the rear aperture, the shutter plane and at infinity (the divergence plane). The beam profiles are imaged on a fluorescent screen which is monitored by a visible light camera. Images of the profiles may be discharged on the screen of a lap top computer.

DETAILED DESCRIPTION OF PREFERRED EMBODIMENTS

A preferred embodiment of the present invention can be described by reference to the figures. This embodiment 2 weighs about 30 pounds, has dimensions of about 6 inches ×18 inches ×22 inches and has a handle 4 so it can be easily carried to a laser field site and fits easily in the overhead compartment of a commercial airliner. This particular embodiment is specifically designed to measure beam profiles of deep ultraviolet gas discharge lasers used for integrated circuit lithography. These lasers are expensive lasers and are part of lithography machines which costs several million dollars. The lithography systems typically operate 24 hours per day, seven days per week except for short schedule downtimes for maintenance. It is normally important that diagnostic and maintenance work be completed efficiently and quickly.

The preferred embodiment described here is valuable because it is easily carried by hand into the laser area of an integrated circuit fabrication plant during scheduled maintenance to quickly and reliably obtain accurate beam profile readings. It is anticipated that users of the lithography lasers can achieve more profitable operations when beam profile data is available, for example by keeping a robust laser in service well beyond the factory guaranteed lifetime, or by detecting and repairing a defective or out of alignment laser before production quality of integrated circuits being fabricated is affected.

Figure 5:
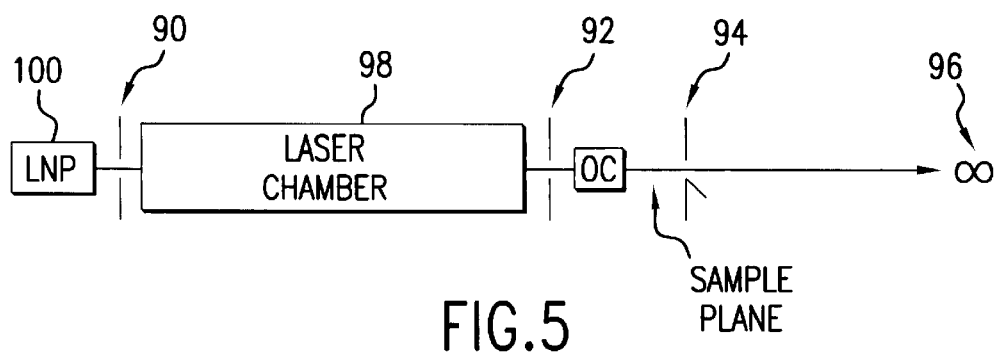
FIG. 5 shows beam locations where profiles are monitored with the above preferred embodiment.

Control knobs on the instrument allow the operator to select among four fundamentally important measurement planes for the laser beam shown in FIG. 5. These are the front aperture 92, the rear aperture 90 between the laser chamber 98 and the line narrowing package 100, the shutter plane 94 and at beam infinity 96 called herein the divergent plane.

Figure 1:
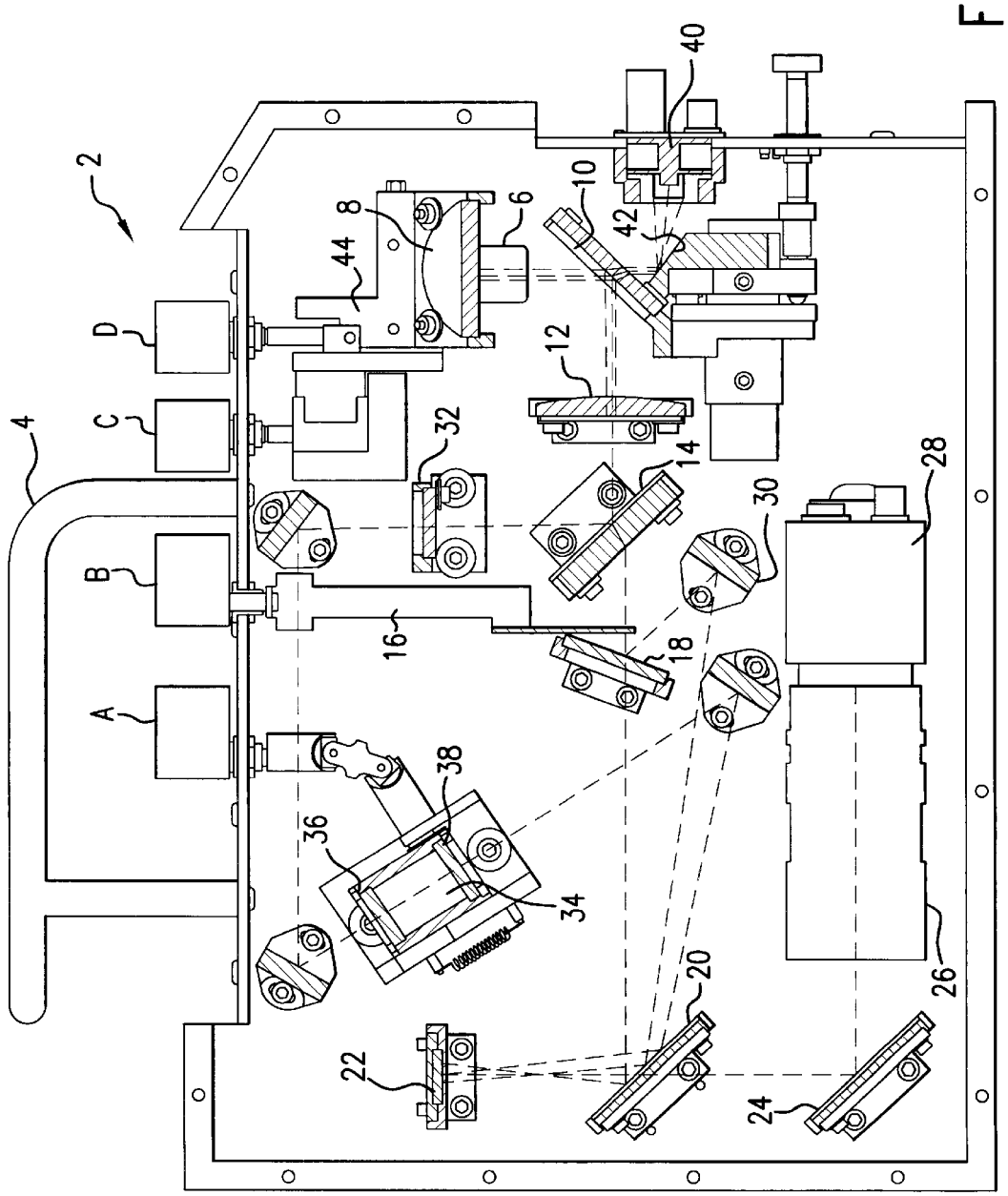
FIG. 1 is a drawing important components of a preferred embodiment of the present invention.
Figure 4:
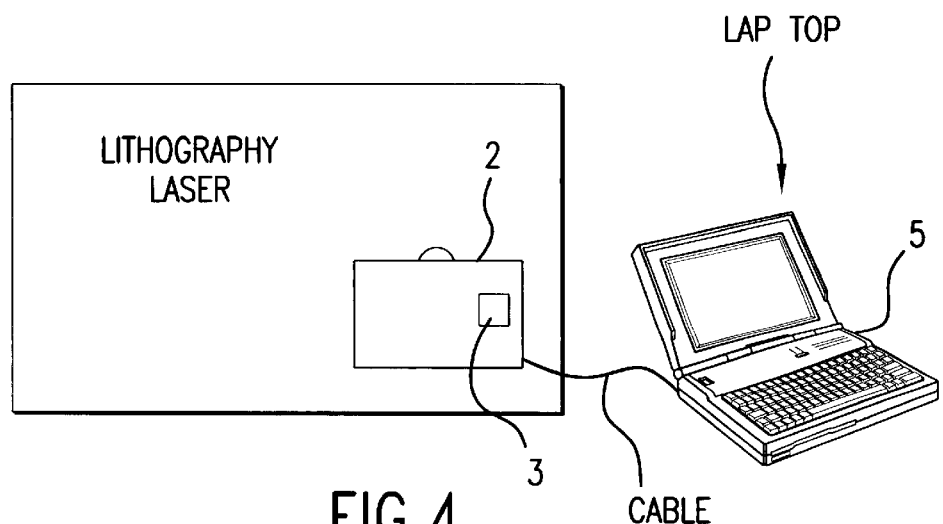
FIG. 4 is a drawing showing the preferred embodiment sampling beam profiles.

Important features of this preferred embodiment are shown in FIG. 1. The monitor is bolted on to a lithography laser as shown in FIG. 4 with bolts not shown so that the laser beam enters the instrument thru a rectangular port 6 (which would be through the back of the FIG. 1 page) in the baseplate of the monitor 2 and about 4% of the energy in the beam is reflected by the front surface of an uncoated fused silica wedge 8. (In the FIG. 4 example a diagnostic mirror turns the beam into the monitor mounted on a side of the laser.) This 4% sample is further attenuated and redirected by a second uncoated wedge 10. Wedges 8 and 10 are each mounted on translation stages and wedge 10 is further equipped with a two axis tilt stage. These 4 degrees of adjustment (2 tilt, 2 translation) allow the beam sample reflected by the front of wedge 10 to be directed to the center of the objective lens 12 at an input angle aligned with the optical axis defined by the lens 12. These adjustments are necessary to achieve accurate and reproducible measurement results. (Without them, laser to laser variations in the mechanical tolerance stack up with the laser and portable tool mounting accessories and would add unpredictable (although within a known range) tilt and decenter aberations to the measurement.) Proceding from the objective lens 12 is the first beam splitter 14 from which transmitted and reflected beams are obtained. Different focussing conditions are applied to the two beams with the proper choices of the lenses shown in FIG. 1 so as to image various locations for the beam profile as discussed below. A compact beam selector flag 16 is rotated by manual control knob B to block one path or the other allowing the unblocked path to continue. The sample transmitted by beam splitter 14 proceeds to the second beam splitter 18 which again creates two independent paths for image formation. The beam transmitted by beam splitter 18 is reflected by uv-reflecting, visible transmitting mirror 20 onto a flat fluorescent screen 22 where an image of the laser cavity rear aperture is projected by the ultraviolet beam and results in a visible light image on screen 22 which accurately reproduces the intensity profile of the ultraviolet beam profiled at the laser cavity rear aperture. For all measurement modes, some of the visible light emitted by screen 22 is transmitted by UV reflecting, visible transmitting mirror 20 and reflected by mirror 24 into a camera lens 26 and a machine vision quality CCD camera 28. The resulting video is routed to a Lap Top PC for analysis as shown in FIG. 4 and described below. Returning to the optical paths, the reflected beam from beam splitter 18 follows a longer path via mirror 30 and 20 to form an image of the front laser aperture at the fluorescent screen 22. We obtain the advantage of a very compact design in this way by accepting different magnifications for front and rear aperture images. The reflectivity of beam splitter 18 is about 90% so the different size images have similar brightness on screen 22. By actuating knob B the other modes which use the reflected beam from beam splitter 14 can be made available. In this case knob A selects between the divergence plane (infinity) or the shutter plane. The reflected beam from beam splitter 14 is directed to a concave lens 32 to obtain a telephoto lens combination with the objective lens 12. Again, a compact design as required for convenient field usage is obtained with a 1 meter effective focal length over a considerably shorter mechanical distance. The divergence image is obtained at screen 11 when the lens cell 34 is rotated by knob A to allow the beam to pass between two lenses 36 and 38 which are above and below the beam path in that setting. In the other setting for knob A the two lenses are accurately located on center and on axis with respect to the beam path. This results in a four lens imaging system which projects an image of the shutter plane onto screen 22.

A further advantage of the embodiment of the present invention is the provision for other optical measurements in addition to beam profiles. The laser pulse temporal profile is available from fast photodiode 40 which is illuminated by diffused light from a roughened metal surface 42 which is illuminated by the transmitted beam of the sample wedge 10. The capability to "piggyback" other optical transducers onto the monitor is provided by a lever arm design on translation stage 44 such that at one end of the stage travel, the first wedge 8 swings out of the beam path allowing access to the entire beam for purposes such as total power measurement with a monitor (mounted at position 3 as shown in FIG. 4) looking into the plane of the figure.

Figure 2:
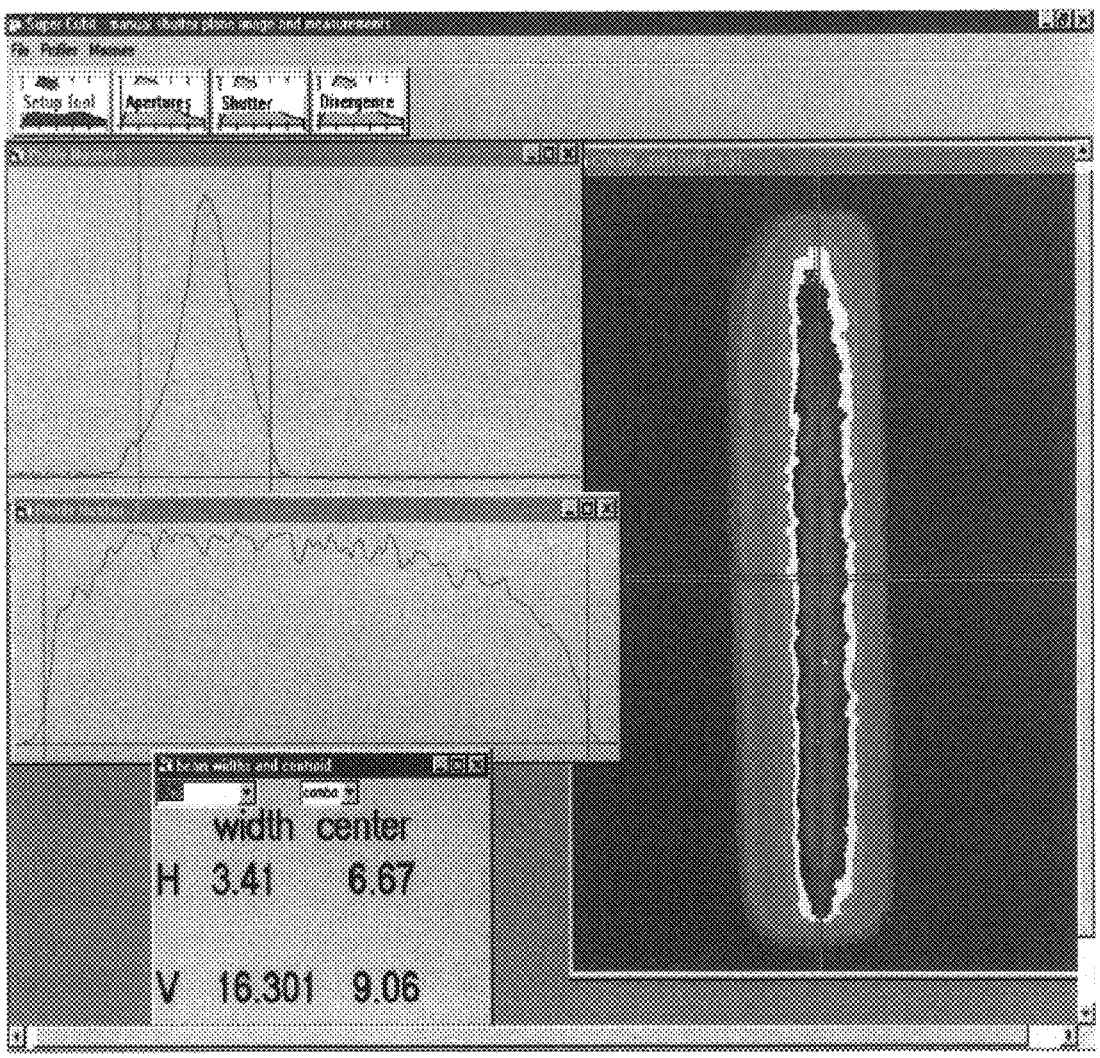
FIG. 2 is a copy of a lap top computer screen showing beam profile data.
Figure 3:
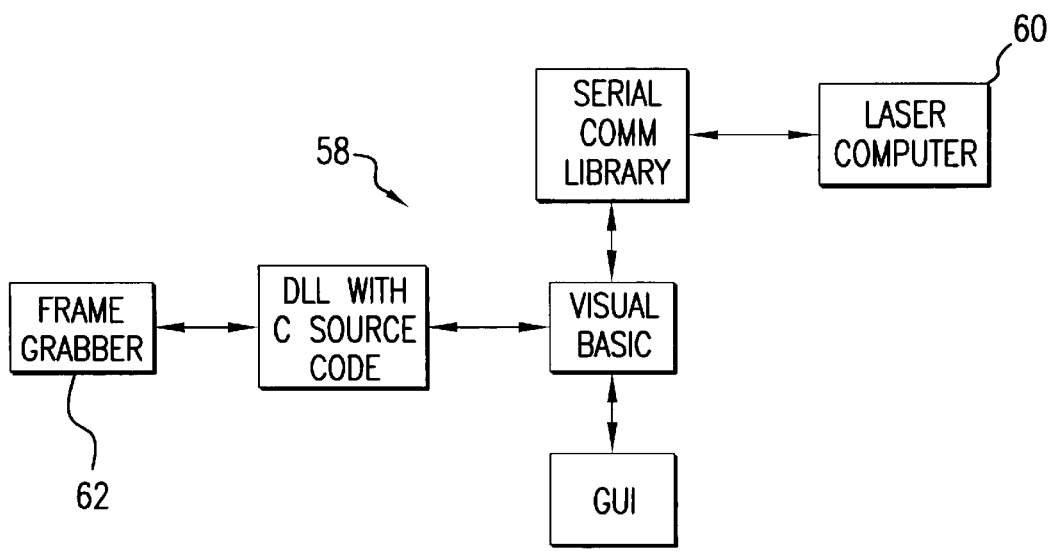
FIG. 3 is a chart showing software elements of the preferred embodiment.

Applicants have implemented this invention by designing and building the durable and ergonomic opto-mechanical instrument described herein. The preferred embodiment includes a cable not shown which feeds video from an CCD camera 14 to a card-size video frame grabber such as a video port model supplied by MRT, Inc. which finally is inserted into a standard lap top computer 5 such as a Toshiba Tecra. Software is designed to calculate and display calibrated measurements of various beam profiles. The software allows mass storage and analysis of test data and can be optimized in a variety of ways to decrease total service call time or improve laser performance when adjustments prove necessary. A display screen from pre-release software is shown in FIG. 2 to provide an illustrative example. In FIG. 3 an overview 58 of the software and Lap Top PC interfaces is shown, adding the fact that the laser's Main Control System computer 60 can be linked to the beam profile monitor with a convenient serial cable. By virtue of the data communication link with the laser, valuable capabilities can be achieved, such as secure storage of sensitive customer specific pass/fail specifications in which only the information for the attached laser model is accessible, or the ability to control usage of the monitor on lasers produced by other companies. Frame grabber 62 provides hardware interface from monitor 2 to the random access memory (RAM) of laser computer 60. Low level software functions which primarily move digital image data from frame grabber 62 to computer RAM are implemented in programming language C 64 for efficiency. Overall software operation uses Visual Basic 66 for analysis of video data in the RAM, interaction with the operator with a graphical user interface (GUI) 68 and serial data (RS-232) two-way communication 70 with the laser using commercially available subroutines (COMM library).

FIG. 2 is an example of beam data shown on the GUI (screen of the lap top). At the right is the video signal from the CCD, which has been processed by the software so that increasing levels of brightness are shown as contrasting colors (false color display) to facilitate visual assessment of the beam profile structure. Vertical and horizontal bands are shown superimposed on the beam image. Plots of the intensity versus position in the bands are shown at left. From these plots, information such as width and symmetry can be calculated and displayed.

In this preferred embodiment, the lenses discussed above are selected to reimage the laser beam at planes 90, 92, 94 and 96 on to screen 22. In the case of each lens the lens mounts are slotted in order to permit fine adjustment when assembling the components.

Although the present invention has been described in terms of a particular embodiment persons skilled in the laser art will recognize that many changes and modifications could be made without altering its scope. Therefore, the scope of the present invention should be determined by the appended claims and their legal equivalents.

We claim:

1. A portable laser beam monitor comprising:
    A) a carrying case;
    B) a mounting means for mounting said carrying case on a ultraviolet laser defining a beam path;
    C) an optical system contained in said carrying case for monitoring beam profiles at a plurality of positions along said beam path said optical system comprising:
        1) a fluorescent screen,
        2) a plurality of optical trains for imaging the laser beam at each of said plurality of positions onto said fluorescent screen to produce for each position a visible image on said screen,
        3) a visible camera focused on said screen for monitoring beam profiles at said plurality of positions, and
        4) a selection means for selecting one or more of said trains for monitoring one or more of said plurality of positions.

2. A monitor as in claim 1 wherein said plurality of positions comprises a rear aperture, a front aperture, a shutter plane and a divergence plane.

3. A monitor as in claim 1 wherein said visible camera is a CCD camera.

4. A monitor as in claim 1 and further comprising a connection port for connecting a computer having a graphical user interface.

5. A monitor as in claim 1 and further comprising a pulse energy monitor.

6. A laser beam monitoring system comprising:
    A) A portable laser beam monitor comprising:
        1) a carrying case;
        2) a mounting means for mounting said carrying case on a ultraviolet laser defining a beam path;
        3) an optical system contained in said carrying case for monitoring beam profiles at a plurality of positions along said beam path said optical system comprising:
            a) a fluorescent screen,
            b) a plurality of optical trains for imaging the laser beam at each of said plurality of positions onto said fluorescent screen to produce for each position a visible image on said screen,
            c) a visible camera focused on said screen for monitoring beam profiles at said plurality of positions, and d) a selection means for selecting one or more of said trains for monitoring one or more of said plurality of positions, B) a portable computer system comprising:
   a) a frame grabber,
   b) a graphical user interface, and
   c) a random access memory.

7. A monitor as in claim 6 wherein said plurality of positions comprises a rear aperture, a front aperture, a shutter plane and a divergence plane.

8. A monitor as in claim 6 wherein said visible camera is a CCD camera.

9. A monitor as in claim 6 and further comprising a connection port for connecting a computer having a graphical user interface.

10. A monitor as in claim 6 and further comprising a pulse energy monitor.

* * * * *